(12) United States Patent
Zuo et al.

(10) Patent No.: US 10,826,470 B2
(45) Date of Patent: Nov. 3, 2020

(54) INTEGRATING RAMP CIRCUIT WITH REDUCED RAMP SETTLING TIME

(71) Applicant: OmniVision Technologies, Inc., Santa Clara, CA (US)

(72) Inventors: Liang Zuo, San Jose, CA (US); Rui Wang, San Jose, CA (US); Hiroaki Ebihara, Santa Clara, CA (US); Nijun Jiang, Shanghai (CN)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/352,673

(22) Filed: Mar. 13, 2019

(65) Prior Publication Data

US 2020/0295739 A1    Sep. 17, 2020

(51) Int. Cl.
| | |
|---|---|
| *H03K 4/56* | (2006.01) |
| *H04N 5/3745* | (2011.01) |
| *H03M 1/56* | (2006.01) |
| *H04N 5/378* | (2011.01) |
| *H04N 5/369* | (2011.01) |
| *H03F 3/45* | (2006.01) |

(52) U.S. Cl.
CPC ............ *H03K 4/56* (2013.01); *H03F 3/45269* (2013.01); *H03M 1/56* (2013.01); *H04N 5/3698* (2013.01); *H04N 5/378* (2013.01); *H04N 5/37457* (2013.01); *H03F 2203/45156* (2013.01); *H03F 2203/45512* (2013.01)

(58) Field of Classification Search
CPC ...... H03K 4/56; H04N 5/378; H04N 5/37457; H04N 5/3698; H03F 3/45269; H03F 2203/45512; H03F 2203/45156; H03M 1/56
See application file for complete search history.

(56) References Cited

U.S. PATENT DOCUMENTS

| | | | |
|---|---|---|---|
| 8,188,903 B2 * | 5/2012 | Yamaoka | H03K 4/08 341/155 |
| 9,307,173 B2 | 4/2016 | Takamiya et al. | |
| 9,571,775 B1 * | 2/2017 | Zuo | H04N 5/3698 |
| 9,848,152 B1 * | 12/2017 | Lin | H04N 5/378 |
| 2006/0001564 A1 * | 1/2006 | Yamagata | H03M 1/0619 341/169 |
| 2006/0125673 A1 * | 6/2006 | Lee | H03K 4/50 341/155 |

(Continued)

*Primary Examiner* — Nhan T Tran
(74) *Attorney, Agent, or Firm* — Christensen O'Connor Johnson Kindness PLLC

(57) ABSTRACT

A ramp generator includes an integrator including a first stage having first and second inputs and first and second outputs, and a second stage including first and second transistors coupled between a power supply rail and ground. A node between the first and second transistors is coupled to the output of the integrator amplifier. A control terminal of the first transistor is coupled to the first output of the first stage, and a control terminal of the second transistor is coupled to the second output of the first stage. A first current flows from the output to ground during a ramp event in the ramp signal generated from the output. Trimming circuitry is coupled to the output of the integrator amplifier to provide a second current to the output of the integrator amplifier in response to trimming inputs. The second current substantially matches the first current.

24 Claims, 6 Drawing Sheets

(56) References Cited

U.S. PATENT DOCUMENTS

2006/0164277 A1* 7/2006 Lee ........................ G06J 1/00
                                                      341/155
2016/0315602 A1* 10/2016 Sohn ..................... H04N 5/378
2018/0167573 A1*  6/2018 Zhu ...................... H04N 5/378
2019/0394415 A1* 12/2019 Liu ..................... H04N 5/3696

* cited by examiner

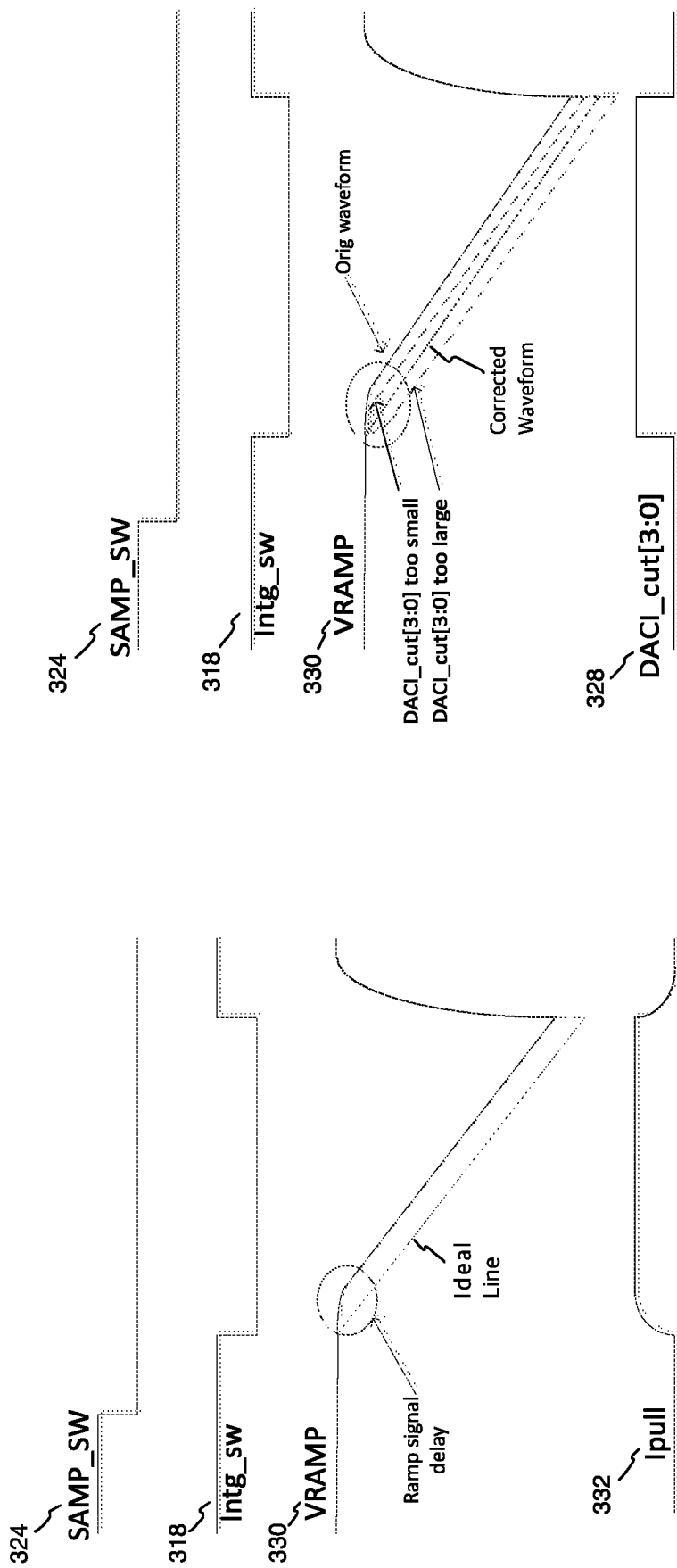

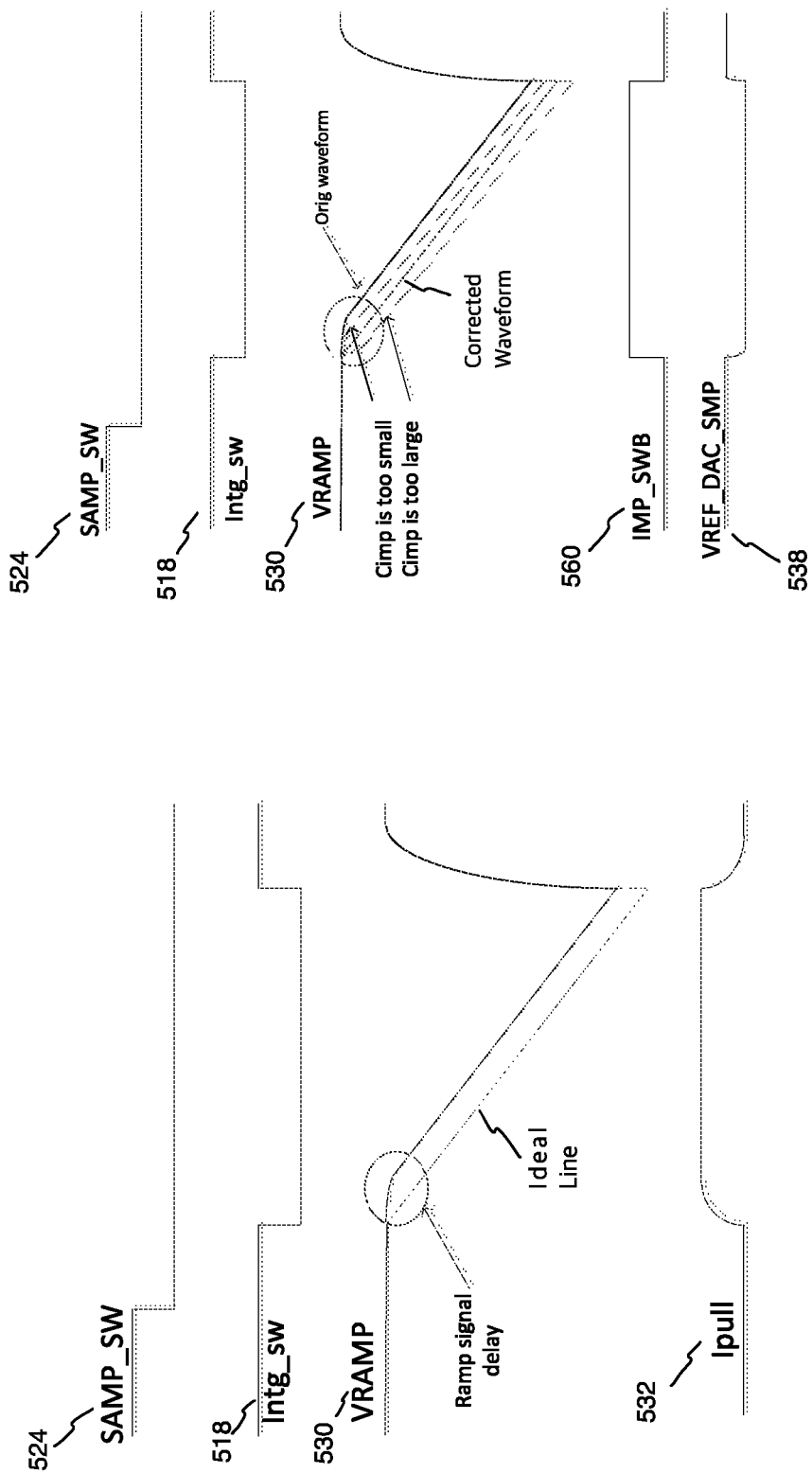

INTEGRATING RAMP CIRCUIT WITH REDUCED RAMP SETTLING TIME

BACKGROUND INFORMATION

Field of the Disclosure

This disclosure relates generally to image sensors, and in particular but not exclusively, relates to comparator output circuitry for use in analog to digital conversion in an image sensor.

Background

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. Analog to digital converters (ADCs) are often used in CMOS image sensors (CIS) to convert the charge into a digital representation of the charge by the image sensor. The ADCs generate the digital representations of the charge based on a comparison of an image charge signal to a reference voltage signal. The reference voltage signal may conventionally be a ramp signal provided by a ramp generator and the comparison may conventionally be performed by a comparator, which provides an output that can be used with a counter to generate the digital representation of the image charge.

It is appreciated that the ramp settling time, or delay, of the ramp signal that is generated by the ramp generator and received by the comparator can limit the maximum frame rate of the image sensor. Thus, reducing the ramp settling time of the ramp signal can increase the maximum frame rate and therefore the performance of the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3A is a timing diagram that illustrates some of the signals in a ramp generator without output stage trimming circuitry in accordance with the teachings of the present invention.

FIG. 3B is a timing diagram that illustrates some of the signals in a ramp generator with output stage trimming circuitry in accordance with the teachings of the present invention.

FIG. 5A is a timing diagram that illustrates some of the signals in a ramp generator without a tunable input in accordance with the teachings of the present invention.

FIG. 5B is a timing diagram that illustrates some of the signals in a ramp generator with tunable input circuitry in accordance with the teachings of the present invention.

Figure 1:
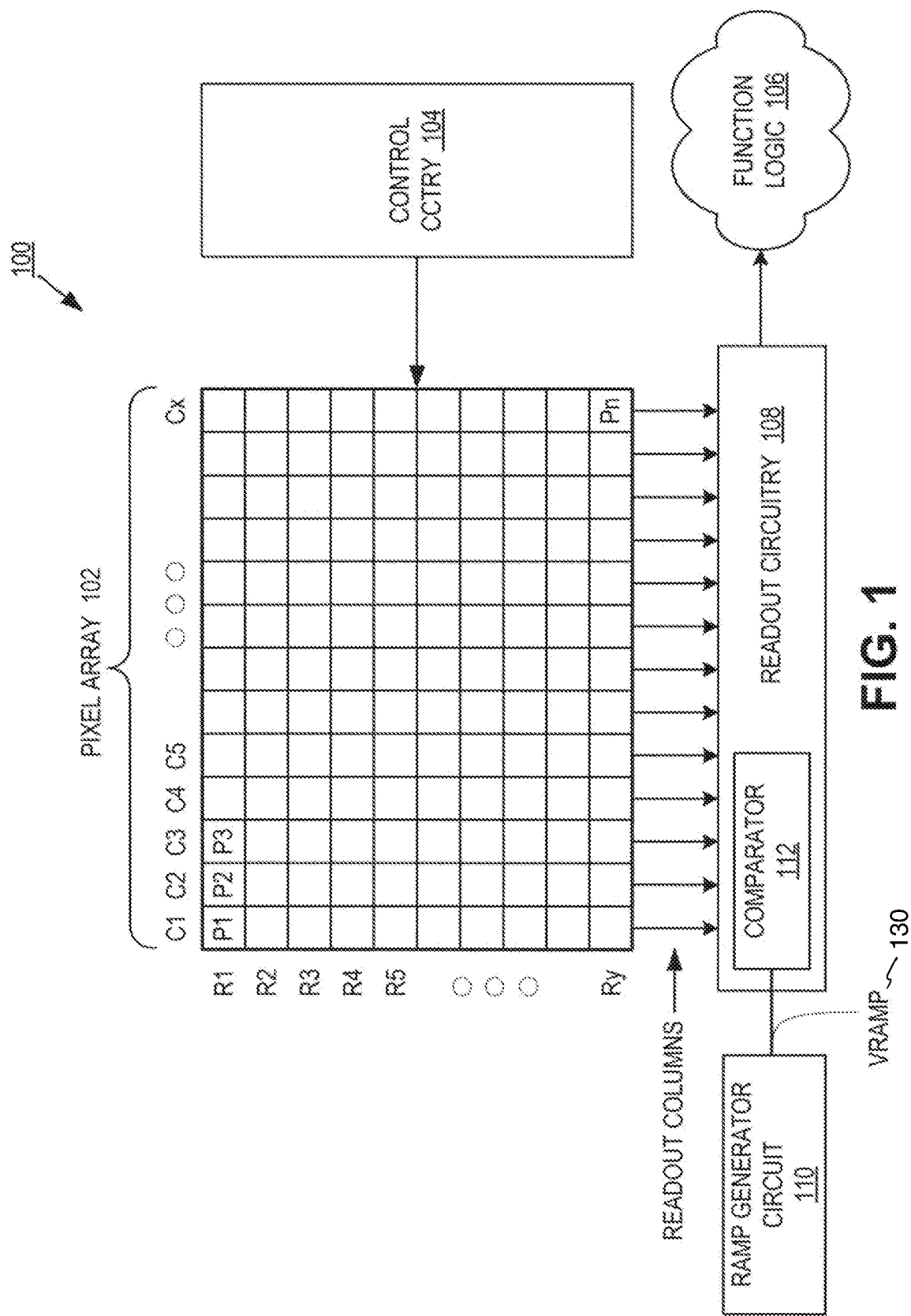
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to a ramp generator that provides a ramp signal with reduced ramp settling time are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 108 and then transferred to function logic 106. Readout circuitry 108 may be coupled to read out image data from the plurality of photodiodes in pixel array 102. In various examples, readout circuitry 108 may include amplification circuitry, analog to digital (ADC) conversion circuitry, or otherwise. In some embodiments, one or more comparators 112 may be included for each of the readout columns. The one or more comparators 112 may be included in a respective analog to digital converter (ADC) included in the readout circuitry 108, for example. In one example, the ADC may be a single slope ADC. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

To perform ADC, for example, the readout circuitry 108 may receive a reference voltage ramp signal VRAMP 130 from a ramp generator circuit 110. VRAMP 130 may be received by the comparator 112, which may also receive an image charge signal from a pixel of the pixel array 102. The comparator 112 may determine a digital representation of the image charge using a counter based on a comparison of VRAMP 130 to the image charge voltage level. In one example, the output circuitry of comparator 112 transitions from a first state to a second state when the input VRAMP 130 voltage reaches the input image charge voltage level. In the example, the value in a counter coupled to the comparator in the ADC may be used to generate the digital representation of the image charge. In one example, the ramp settling time, or delay, of the ramp signal VRAMP 130 that is generated by the ramp generator 110 and received by the comparator 112 is reduced to increase the maximum frame rate and therefore improve the performance of the imaging system 100 in accordance with the teachings of the present invention.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
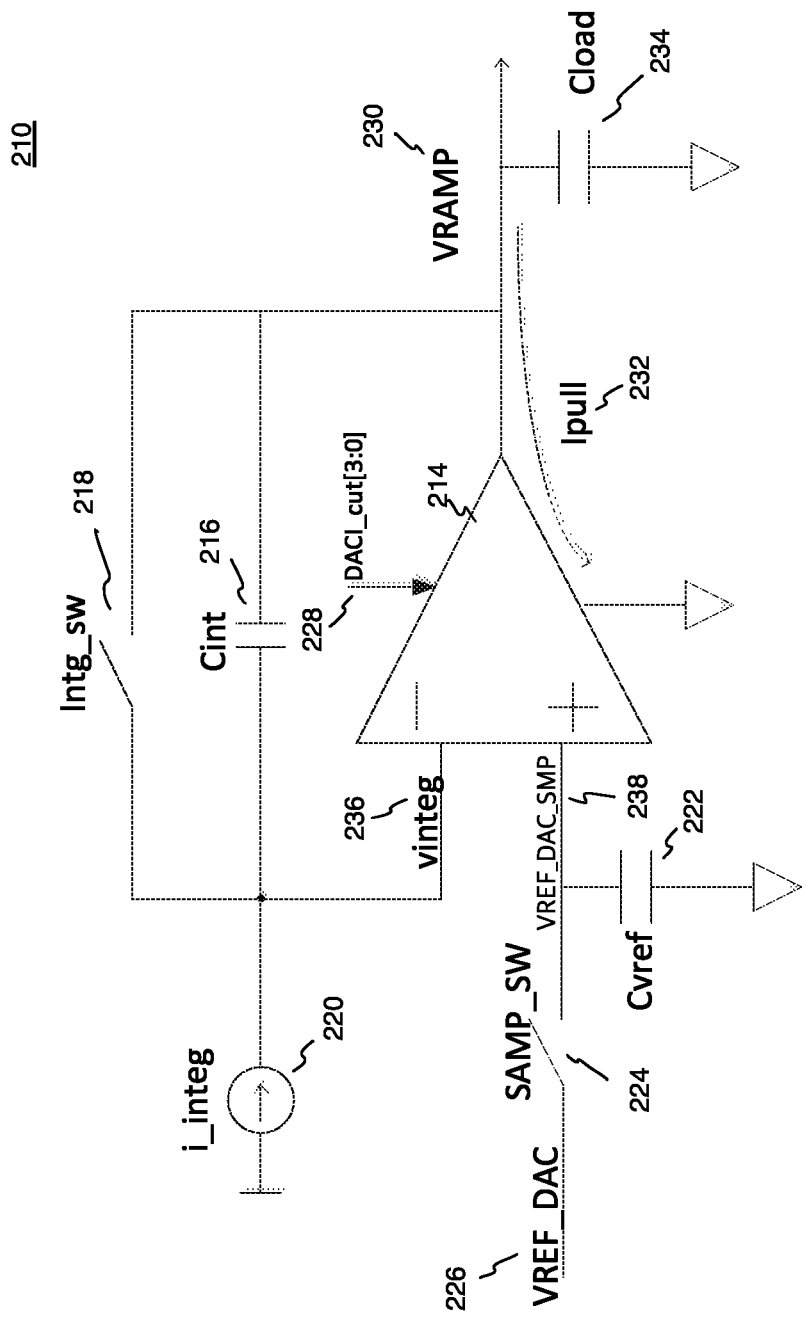
FIG. 2A shows a schematic of an example of a ramp generator with trimming inputs for the output stage of the ramp generator for use with an analog to digital converter in an image sensor in accordance with the teachings of the present invention.

FIG. 2A shows a schematic of an example of a ramp generator 210 with trimming inputs for the output stage of the ramp generator for use with an analog to digital converter in an image sensor in accordance with the teachings of the present invention. It is noted that ramp generator 210 of FIG. 2A may be an example of ramp generator 110 of FIG. 1, and that similarly named and numbered elements referenced below are coupled and function similar to as described above. As shown in the depicted example, ramp generator 210 includes an operational amplifier (op amp) 214 configured as an integrator amplifier with an integrating capacitor Cint 216 coupled between the output and the inverting input of op amp 214. A switch Intg_sw 218 is also coupled between the output and the inverting input of op amp 214 to enable and disable the integrator. The inverting input of op amp 214 is coupled to receive a feedback input voltage vinteg 236, and is also coupled to current source 220, which provides an integrator current i_integ. The non-inverting input of op amp 214 is coupled to receive a reference input voltage VREF_DAC_SMP 238. A reference voltage capacitor Cvref 222 is coupled to the non-inverting input of op amp 214 to sample the reference voltage VREF_DAC 226 through a sampling switch SAMP_SW 224 on to reference voltage capacitor Cvref 222. The output of op amp 214 is coupled to generate the output ramp signal VRAMP 230 across a load capacitor Cload 234.

In operation, the switch Intg_sw 218 is closed (e.g., turned on) to disable and reset the ramp generator 210 by resetting the voltage across Cint 216. The switch Intg_sw 218 is opened (e.g., turned off), which enables the integrator current i_integ to flow from current source 220 into capacitor Cint 216 to begin generating a ramp of the ramp signal VRAMP 230 at the output of op amp 210. At the onstage of the ramp in the ramp signal VRAMP 230, due to the existence of the capacitance Cload 234, which is representative of the capacitance distributed in column level circuits of an imaging system, a current Ipull 232 is pulled into the op amp 214 to ground through an output stage or second stage of op amp 214 during a ramp event in the ramp signal VRAMP 230 output of the op amp 214. The existence of the capacitance Cload and the consequential current Ipull 232 can be a major cause for delay in the ramp of ramp signal VRAMP 230, which increases the ramp settling time of the ramp signal VRAMP 230. In the depicted example, op amp 214 is also coupled to receive trimming inputs DACI_cut [3:0] 288, which are coupled to be received by trimming circuitry in an output stage of op amp 214 to compensate for the current Ipull 232, and improve the ramp settling time of VRAMP 230 in accordance with the teachings of the present invention.

Figure 2B:
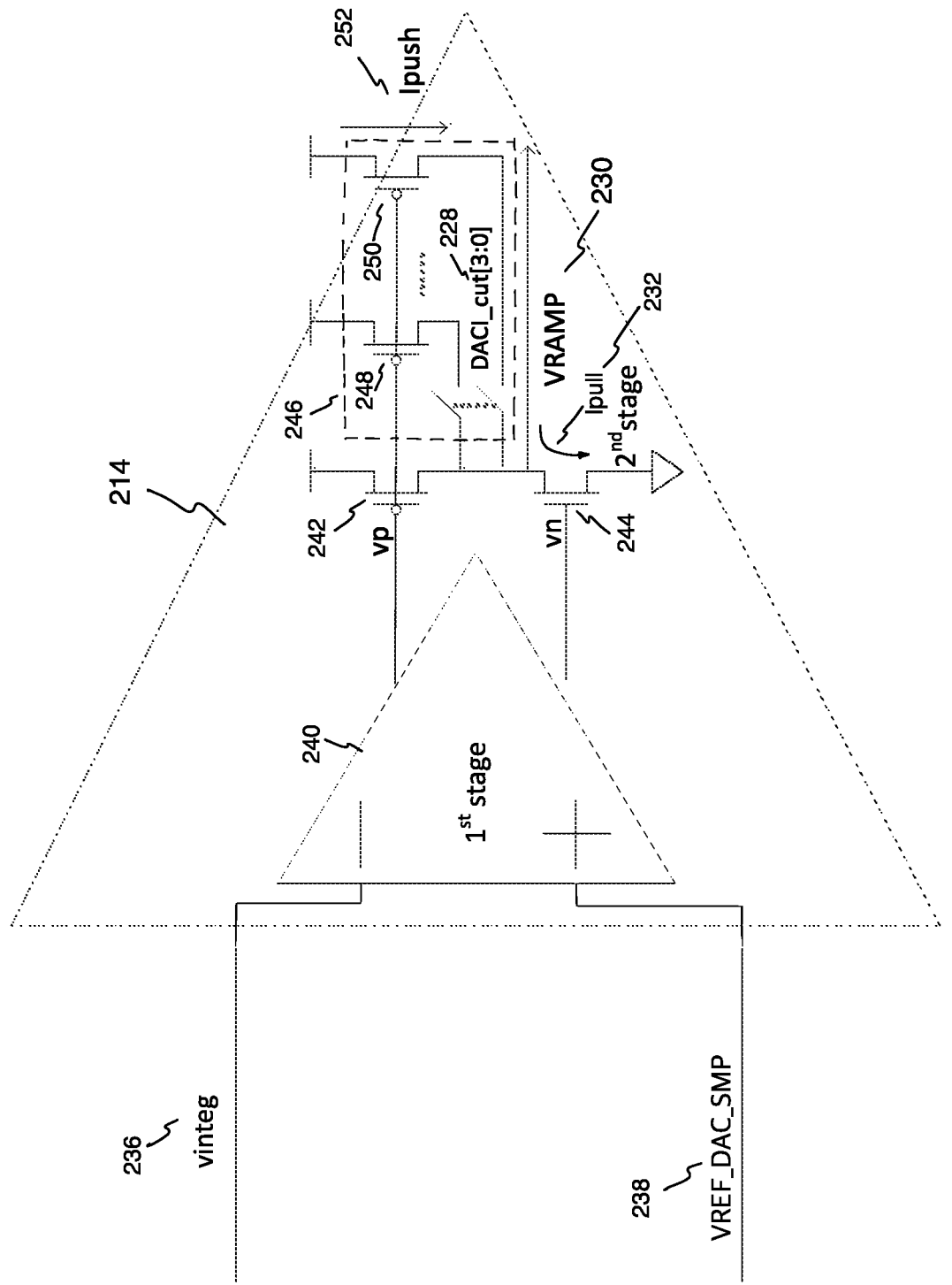
FIG. 2B shows a schematic of an example of an op amp with output stage trimming circuitry included in an ramp generator as illustrated in FIG. 2A for use with an analog to digital converter in an image sensor in accordance with the teachings of the present invention.

FIG. 2B shows a schematic of an example of an op amp with output stage trimming circuitry included in a ramp generator as illustrated in FIG. 2A for use with an analog to digital converter in an image sensor in accordance with the teachings of the present invention. It is noted that op amp 214 of FIG. 2B may be an example of op amp 214 of FIG. 2A with increased detail, and that similarly named and numbered elements referenced below are coupled and function similar to as described above. As shown in the depicted example, op amp 214 includes an input stage or first stage 240, which includes an op amp 240 having an inverting input coupled to receive the feedback voltage vinteg 236, and a non-inverting input coupled to receive the sampled reference input voltage VREF_DAC_SMP 238. Op amp 240 has a first output vp that is coupled to the gate of PMOS transistor 242, and a second output vn that is coupled to the gate of NMOS transistor 244.

In the example illustrated in FIG. 2B, the output stage or second stage of op amp 214 includes transistors 242 and 244, which are coupled between a power supply rail and ground. The node between transistors 242 and 244 is the output node of the second stage, and is configured to generate the output ramp signal VRAMP 230. As mentioned previously, at the onstage of the ramp in the ramp signal VRAMP 230, a current Ipull 232 is pulled into the op amp 214 through the second stage of op amp 214 to ground through transistor 244.

To compensate for the current Ipull 232, op amp 240 also includes trimming circuitry 246 in the second stage coupled to the output node of the second stage in accordance with the teachings of the present invention. As shown, trimming circuitry 246 includes a plurality of transistors 248-250 coupled between the power supply rail and the output of the op amp 214. It is noted that although the example illustrated FIG. 2B shows that trimming circuitry 246 includes two transistors 248 and 250, it is appreciated that in other examples trimming circuitry 246 may include less than two or greater than two transistors, each of which is coupled to be controlled in response to a respective one of the trimming inputs DACI_cut [3:0] 228.

Continuing with the example shown in FIG. 2B, each of the plurality of transistors 248-250 includes a control terminal or gate terminal that is coupled to the control terminal or gate terminal of transistor 242 to receive the vp output of the first stage op amp 240. In addition, each one of the plurality of transistors 248-250 is also selectively coupled in response to respective one of the trimming inputs DACI_cut [3:0] 228 to the output node of the second stage of op amp 214 that generates VRAMP 230. In the depicted example, each one of the plurality of transistors 248-250 is selectively coupled to the output node of the second stage of op amp 214 via a respective switch in response to the trimming inputs DACI_cut [3:0] 228, as shown. In operation, each of the trimming inputs DACI_cut [3:0] 228 individually control the appropriate number of the plurality of transistors 248-250 of the trimming circuitry 246 at the onset of the ramp event in VRAMP 230 to control a current Ipush 252 that flows through the trimming circuitry 246 to the output node that generates VRAMP 230 and compensate for the current Ipull 232 to reduce the delay in the ramp of VRAMP 230, and therefore improve the ramp settling time of VRAMP 230 in accordance with the teachings of the present invention.

To illustrate, FIG. 3A is a timing diagram that illustrates some of the signals in a ramp generator as illustrated for example in FIG. 2A, but without output stage trimming circuitry in accordance with the teachings of the present invention. As shown, the switch SAMP_SW 324 and the switch Intg_sw 318 are initially closed to sample the VREF_DAC voltage 226 onto the reference voltage capacitor Cvref 222, and reset the voltage across the Cint 216 capacitor before the ramp starts. The sampling switch SAMP_SW 324 is then turned off, at which time the reference input voltage VREF_DAC_SMP 238 has been sampled into the reference voltage capacitor Cvref 222. The switch Intg_sw 318 is then turned off, which begins the onset of the ramp event in the VRAMP 330 output as shown. However, at this time the Ipull 332 current begins flow into the output of the ramp generator to ground due to the existence of the Cload 234 capacitance at the output of the ramp generator.

As shown in FIG. 3A, the Ipull 332 current causes a delay in the ramp signal at the onset of the ramp event. An "ideal line" (dashed line) for the ramp in VRAMP 330 can be characterized by the linear function:

Ideal Line: Kt.

However, as a consequence of the effects of the load parasitic capacitance Cload and Ipull 332, the ramp signal is delayed and is instead characterized by:

Delayed Ramp Signal:

$$Kt - K\tau(1 - e^{-\frac{t}{\tau}}).$$

A major consequence of the delayed ramp signal caused by Ipull 332 is increased ramp settling time, which increases the amount of time required to read image data from the image sensor, which decreases the possible maximum frame rate of the image sensor.

Thus, FIG. 3B is a timing diagram that illustrates some of the signals in a ramp generator with output stage trimming circuitry to compensate for Ipull 332 in accordance with the teachings of the present invention. As shown, the switch SAMP_SW 324 and the switch Intg_sw 318 are initially closed to sample the VREF_DAC voltage 226 onto the reference voltage capacitor Cvref 222, and reset the voltage across the Cint 216 capacitor before the ramp starts. The sampling switch SAMP_SW 324 is then turned off, at which time the reference input voltage VREF_DAC_SMP 238 has been sampled onto the reference voltage capacitor Cvref 222. The switch Intg_sw 318 is then turned off, which begins the onset of the ramp event in the VRAMP 330 output as shown. For the purpose of comparison, the "Orig waveform" in FIG. 3B illustrates the ramp in VRAMP 330 without compensating for Ipull 332.

However, FIG. 3B also illustrates that the trimming inputs DACI_cut [3:0] 328 also activate and control the plurality of transistors 248-250 in the trimming circuitry 246 at the same time the switch Intg_sw 318 is turned off at the onset of the ramp event in VRAMP 330. As will be shown, different DACI_cut [3:0] 328 bits can be trimmed to achieve an ideal linear ramp (e.g., "Ideal Line" in FIG. 3A) in VRAMP 330 in accordance with the teachings of the present invention. In particular, at the onset of ramp event, in order to maintain the operation point, some portions of the second stage of the op amp 214 can be turned off in response to the trimming inputs DACI_cut [3:0] 328. In so doing, the current Ipush 252 that flows through the second stage of op amp 214 can substantially match Ipull 232. The value of Ipull can be determined by the ramping rate and the Cload 234 value. As such, the feedback vinteg 236 voltage at the non-inverting input of the op amp 214 can be stable, so the ramp in the VRAMP 230 signal can be close to the linear "Ideal Line" ramp. Thus, the ramp "Corrected Waveform" in VRAMP 330 that results from the Ipush 252 current that is controlled in response to the trimming inputs DACI_cut [3:0] 328 when the switch Intg_sw 318 is turned off closely follows the linear characteristic of the "Ideal Line" for the ramp in VRAMP 330 characterized by Kt as soon as the Intg_sw318 switch is turned off in accordance with the teachings of the present invention.

For comparison, FIG. 3B also illustrates "DACI_cut [3:0] too small" to show the ramp in VRAMP 330 if not enough current flows through the Ipush 252 current, and "DACI_cut [3:0] too large" to show the ramp in VRAMP 330 if too much current flows through the Ipush 252 current. Thus, the DACI_cut [3:0] signals can be initially programmed to appropriately control the plurality of transistors 248-250 in trimming circuitry 246 to compensate for Ipull 332 in accordance with the teachings of the present invention.

Figure 4:
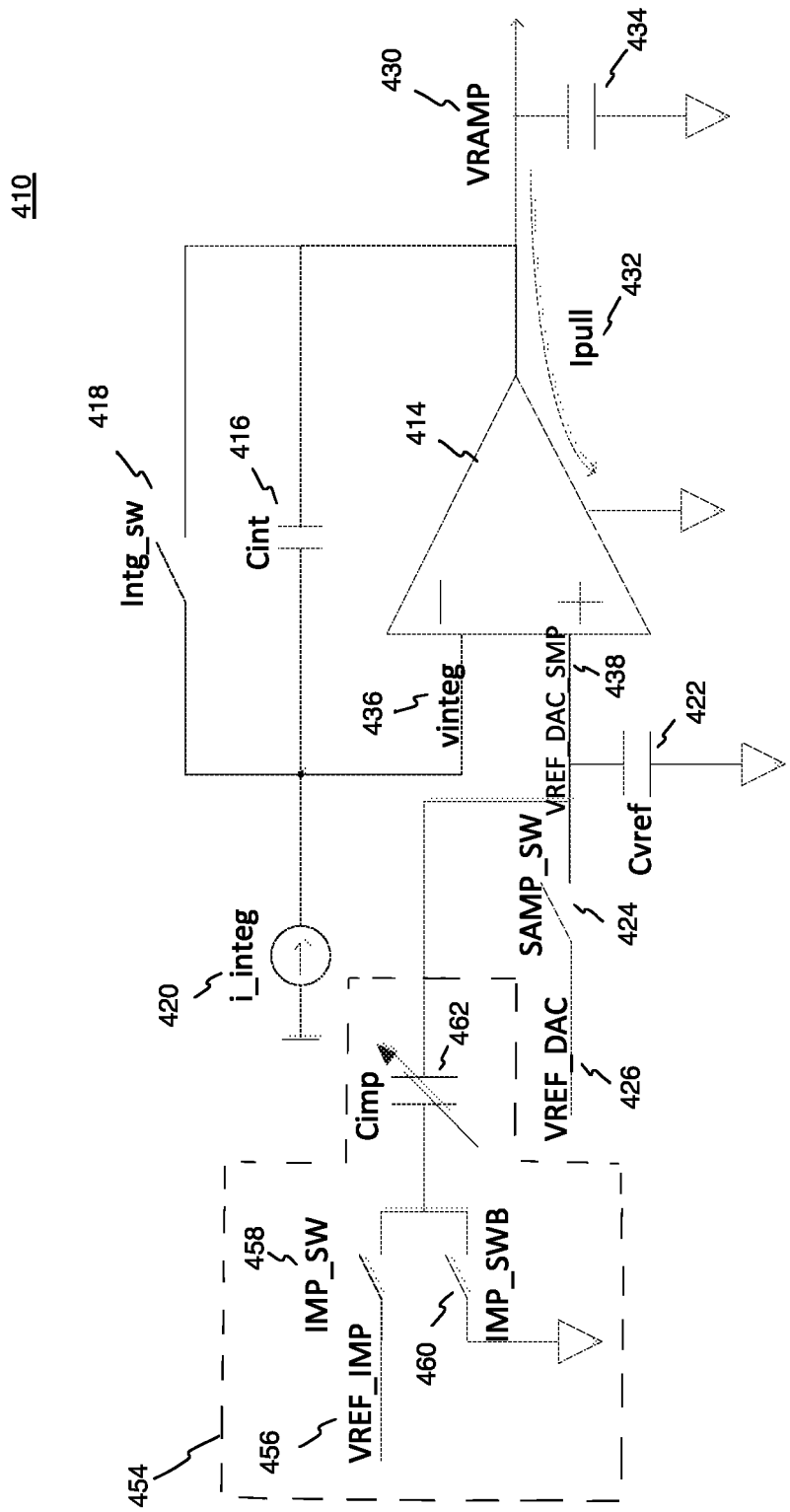
FIG. 4 shows a schematic of another example of a ramp generator with tunable input circuitry for use with an analog to digital converter in an image sensor in accordance with the teachings of the present invention.

FIG. 4 shows a schematic of another example of a ramp generator 410 for use with an analog to digital converter in an image sensor in accordance with the teachings of the present invention. It is noted that ramp generator 410 of FIG. 4 may be an example of ramp generator 210 of FIG. 2A, and/or ramp generator 110 of FIG. 1, and that similarly named and numbered elements referenced below are coupled and function similar to as described above. In addition, it is also noted that ramp generator 410 of FIG. 4 shares many similarities with ramp generator 210 of FIG. 2A. However, one difference between ramp generator 410 of FIG. 4 and ramp generator 210 of FIG. 2A is that the example ramp generator 410 of FIG. 4 does not receive trimming inputs DACI_cut [3:0] or trimming circuitry in an output stage of op amp 414. Instead, ramp generator 410 of FIG. 4 includes tuning circuitry 454 coupled to the non-inverting input of op amp 414 to tune the reference input voltage of the integrator amplifier in order to compensate for the current Ipull 432 in accordance with the teachings of the present invention.

As shown in the depicted example, ramp generator 410 includes op amp 414 configured as an integrator amplifier with an integrator capacitor Cint 416 coupled between the output and the inverting input of op amp 414. A switch Intg_sw 418 is also coupled between the output and the inverting input of op amp 414 to enable and disable the integrator. The inverting input of op amp 414 is coupled to receive a feedback input voltage vinteg 436, and is also coupled to current source 420, which provides a current i_integ. The non-inverting input of op amp 414 is coupled to receive a reference input voltage VREF_DAC_SMP 438. A reference voltage capacitor Cvref 422 is coupled to the non-inverting input of op amp 414 to sample the reference voltage VREF_DAC 426 through a sampling switch SAMP_SW 424 onto reference voltage capacitor Cvref 422. As will be discussed, the tuning circuitry 454 tunes the reference input voltage VREF_DAC_SMP 438 received at the non-inverting input of op amp 414 to compensate for the Ipull 432 current in accordance with the teachings of the present invention. The output of op amp 414 is coupled to generate the output ramp signal VRAMP 430 across a load capacitor Cload 434.

As shown in the depicted example, tuning circuitry 454 includes a tuning capacitance implemented with a variable capacitance Cimp 482 with one end coupled to the non-inverting input of op amp 414. The other end of variable capacitance Cimp 482 is coupled to switching circuitry that includes a switch 458 and a switch 460. In the depicted example, the switching circuitry is configured to couple the variable capacitance Cimp 482 to either tuning voltage VREP_IMP 456 or ground. In particular, the switch 458 is configured to couple variable capacitance Cimp 482 to a VREF_IMP 456 voltage in response to a signal IMP_SW, and switch 460 is configured to couple variable capacitance Cimp 482 to ground in response to a complementary signal IMP_SWB. In the depicted example, variable capacitance Cimp 482 is coupled to the tuning voltage VREF_IMP 456 when the integrator amplifier is disabled, and the variable capacitor is coupled to ground during a ramp event in the ramp signal VRAMP 430 when the integrator amplifier is enabled.

FIG. 5A is a timing diagram that illustrates some of the signals in a ramp generator as illustrated in FIG. 4, but without a tunable input in accordance with the teachings of the present invention. As shown, the switch SAMP_SW 524 and the switch Intg_sw 518 are initially closed to sample the VREF_DAC voltage 426 onto the reference voltage capacitor Cvref 422, and reset the voltage across the Cint 416 capacitor before the ramp starts. The sampling switch SAMP_SW 524 is then turned off, at which time the reference input voltage VREF_DAC_SMP 438 has been sampled into the reference voltage capacitor Cvref 422. The switch Intg_sw 518 is then turned off, which begins the onset of the ramp event in the VRAMP 530 output as shown. However, at this time the Ipull 532 current begins flow into the output of the ramp generator to ground due to the existence of the Cload 434 capacitance at the output of the ramp generator. The Ipull 332 current causes a delay in the ramp signal at the onset of the ramp event. An "ideal line" for the ramp in VRAMP 330 is labeled in FIG. 5A as the dashed line having the linear characteristics of:

Kt.

However, as a consequence of the effects of the Ipull 532, the ramp signal is delayed and is instead characterized by:

$$Kt - K\tau(1 - e^{-\frac{t}{\tau}}),$$

which increases the amount of time required to read image data from the image sensor and decreases the possible maximum frame rate of the image sensor.

Thus, FIG. 5B is a timing diagram that illustrates some of the signals in a ramp generator with tunable input circuitry in accordance with the teachings of the present invention. As shown, the switch IMP_SWB 560 is initially opened, which indicates that the switch IMP_SW 458 is initially closed. In addition, the switch SAMP_SW 524 and the switch Intg_sw 518 are also initially closed. Thus, the reference voltage capacitor Cvref 422 is initially coupled to sample the reference voltage VREF_DAC 426 through a sampling switch SAMP_SW 424 to sample the voltage VREF_DAC_SMP 538 on to reference voltage capacitor Cvref 422. In addition, the variable capacitance Cimp 462 is initially coupled to VREF_IMP 456 on one end, and to VREF_DAC 426 on the other end. Thus the voltage across variable capacitance Cimp 462 is initialized to the difference between VREF_DAC 426 and VREF_IMP 456.

The sampling switch SAMP_SW 524 is then turned off, at which time the reference input voltage VREF_DAC_SMP 538 has been sampled into the reference voltage capacitor Cvref 422. The switch Intg_sw 518 is then turned off, and the switch 460 is turned on in response to IMP_SWB 560, which indicates that the switch 458 is turned off in response to IMP_SW 558. As shown in the example, the sampling switch SAMP_SW 524 and the IMP_SWB 560 (and complementary IMP_SW 458) are all switched at the same time. This begins the onset of the ramp event in the VRAMP 530 output as shown. For the purpose of comparison, the "Orig waveform" in FIG. 5B illustrates the ramp in VRAMP 530 without compensating for Ipull 432.

At the onset of the ramp event in VRAMP 530, the variable capacitance Cimp 462 switches from being coupled to VREF_IMP 456 through switch 458 to being coupled to ground through switch 460 in response to IMP_SWB 560 as shown. The other end of variable capacitance Cimp 462 is coupled to the non-inverting input of op amp 414. As a result, the reference input voltage VREF_DAC_SMP 538 is pulled down through variable capacitance Cimp 462, which is now coupled to ground through switch 460 at the onset of the ramp event in VRAMP 530. In the depicted example, the values for VREF_IMP 456 and variable capacitance Cimp 462 are turned such that:

$$\frac{\text{VREF\_IMP} \times Cimp}{Cimp + Cvref} = -K\tau.$$

In other words, if the values for VREF_IMP, Cimp, and Cvref are selected (e.g., by tuning Cimp) to substantially match −Kτ, the ramp event in the ramp signal VRAMP 530 will be linear and nearly ideal. Stated in another way, a product of the tuning voltage VREF_IMP 456 and the tuning capacitance Cimp 462 divided by a sum of the tuning capacitance Cimp 462 and the reference voltage capacitance reference voltage capacitor Cvref 422 is equal to a constant −Kτ. To illustrate, the example ramp event labeled "Corrected Waveform" in VRAMP 530 in FIG. 5B results from VREF_IMP, Cimp, and Cvref being tuned such that:

$$\frac{\text{VREF\_IMP} \times Cimp}{Cimp + Cvref} = -K\tau.$$

For comparison, FIG. 5B also illustrates "Cimp too small" to show the ramp in VRAMP 530 if the value selected for Cimp is too small, and "Cimp too large" to show the ramp in VRAMP 530 if the value selected for Cimp is too large.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A ramp generator, comprising:
an integrator amplifier having first and second inputs and an output to generate a ramp signal, wherein the integrator amplifier comprises:
a first stage having first and second inputs and first and second outputs, wherein the first and second inputs of the first stage are coupled to the first and second inputs of the integrator amplifier;
a second stage, comprising:
first and second transistors coupled between a power supply rail and ground, wherein a node between the first and second transistors is coupled to the output of the integrator amplifier, wherein a control terminal of the first transistor is coupled to the first output of the first stage, and wherein a control terminal of the second transistor is coupled to the second output of the first stage, wherein a first current flows from the output of the integrator amplifier through the integrator amplifier to ground during a ramp event in the ramp signal generated from the output of the integrator amplifier; and
trimming circuitry coupled between the power supply rail and the output of the integrator amplifier, wherein the trimming circuitry is coupled to provide a second current to the output of the integrator amplifier in response to trimming inputs, wherein the second current substantially matches the first current.

2. The ramp generator of claim 1, wherein the trimming circuitry is further coupled to the first output of the first stage, wherein the trimming circuitry comprises a plurality of transistors coupled between the power supply rail and the output of the integrator amplifier, wherein the plurality of transistors are coupled to provide the second current to the output of the integrator amplifier in response to the trimming inputs.

3. The ramp generator of claim 1, wherein the integrator amplifier comprises a first op amp including the first stage and the second stage, wherein the first stage of the first op amp comprises a second op amp having the first and second inputs and the first and second outputs.

4. The ramp generator of claim 1, further comprising:
a capacitor coupled between the first input and the output of the integrator amplifier; and
a current source coupled to the first input of the integrator amplifier.

5. The ramp generator of claim 1, further comprising an enable switch coupled between the between the first input and the output of the integrator amplifier, wherein the enable switch is configured to enable and disable the integrator amplifier.

6. The ramp generator of claim 1, further comprising:
a reference voltage capacitance coupled to provide a reference input voltage to the second input of the integrator amplifier; and
a sampling switch coupled between a reference voltage and the second capacitor, wherein the sampling switch is configured to sample the reference voltage onto the reference voltage capacitance.

7. An imaging system, comprising:
an array of pixels to receive image light and generate an image charge voltage signal in response; and
readout circuitry coupled to the receive the image charge voltage signal from the array of pixels and provide a digital representation of the image charge voltage signal in response, the readout circuitry including a comparator to receive the image charge, compare the image charge voltage signal to a ramp signal from a ramp generator, and provide the digital representation of the image charge voltage signal in response, wherein the ramp generator comprises:
an integrator amplifier having first and second inputs and an output to generate the ramp signal, wherein the integrator amplifier comprises:
a first stage having first and second inputs and first and second outputs, wherein the first and second inputs of the first stage are coupled to the first and second inputs of the integrator amplifier;
a second stage, comprising:
first and second transistors coupled between a power supply rail and ground, wherein a node between the first and second transistors is coupled to the output of the integrator amplifier, wherein a control terminal of the first transistor is coupled to the first output of the first stage, and wherein a control terminal of the second transistor is coupled to the second output of the first stage, wherein a first current flows from the output of the integrator amplifier through the integrator amplifier to ground during a ramp event in the ramp signal generated from the output of the integrator amplifier; and trimming circuitry coupled between the power supply rail and the output of the integrator amplifier, wherein the trimming circuitry is coupled to provide a second current to the output of the integrator amplifier in response to trimming inputs, wherein the second current substantially matches the first current.

8. The imaging system of claim 7, wherein the trimming circuitry is further coupled to the first output of the first stage, wherein the trimming circuitry comprises a plurality of transistors coupled between the power supply rail and the output of the integrator amplifier, wherein the plurality of transistors are coupled to provide the second current to the output of the integrator amplifier in response to the trimming inputs.

9. The imaging system of claim 7, wherein the integrator amplifier comprises a first op amp including the first stage and the second stage, wherein the first stage of the first op amp comprises a second op amp having the first and second inputs and the first and second outputs.

10. The imaging system of claim 7, wherein the integrator amplifier comprises:
a capacitor coupled between the first input and the output of the integrator amplifier; and
a current source coupled to the first input of the integrator amplifier.

11. The imaging system of claim 7, wherein the integrator amplifier comprises an enable switch coupled between the between the first input and the output of the integrator amplifier, wherein the enable switch is configured to enable and disable the integrator amplifier.

12. The imaging system of claim 7, wherein the ramp generator further comprises:
a reference voltage capacitance coupled to provide a reference input voltage to the second input of the integrator amplifier; and
a sampling switch coupled between a reference voltage and the second capacitor, wherein the sampling switch is configured to sample the reference voltage onto the reference voltage capacitance.

13. A method for reducing a delay of a ramp event in a ramp signal of a ramp generator, comprising:
generating the ramp signal at an output of an op amp having first and second inputs, wherein the op amp is included in the ramp generator;
coupling an integrator capacitor between the first input and the output of the op amp;
coupling a current source to the first input of the op amp;
coupling a reference voltage capacitance to the second input of the op amp;
sampling a reference voltage onto the reference voltage capacitance with a sampling switch coupled between the reference voltage and the reference voltage capacitance; and
reducing the reference voltage sampled onto the reference voltage capacitance during the ramp event in the ramp signal with a tuning circuit coupled to the second input of the op amp to reduce the delay of the ramp event in the ramp signal.

14. The method of claim 13, further comprising enabling and disabling the ramp generator with an enable switch coupled between the between the first input and the output of the op amp.

15. The method of claim 13, wherein the tuning circuit comprises:
a tuning capacitance coupled to the second input of the op amp; and
switching circuitry coupled to the tuning capacitance, wherein the method further comprises:
coupling the tuning capacitance to a tuning voltage with the switching circuitry when the ramp generator is disabled; and
coupling the tuning capacitance to ground with the switch circuitry when the ramp generator is enabled.

16. The method of claim 15, wherein the switching circuitry comprises:
a first switch coupled between the tuning voltage and the tuning capacitance; and
a second switch coupled between the tuning capacitance and ground.

17. The method of claim 15, wherein the tuning capacitance comprises a variable capacitance, wherein the method further comprises tuning the variable capacitance to cause the ramp event in the ramp signal to be linear.

18. The method of claim 15, wherein a product of the tuning voltage and the tuning capacitance divided by a sum of the tuning capacitance and the reference voltage capacitance is equal to a constant.

19. A method for providing a ramp signal in an imaging system, comprising:
receiving image light with an array of pixels;
generating an image charge voltage signal in response to said receiving the image light; and
receiving the image charge voltage signal with readout circuitry coupled to the array of pixels;
providing a digital representation of the image charge voltage signal in response to said receiving the image charge voltage signal, wherein said providing the digital representation comprises:
comparing the image charge voltage signal to the ramp signal from a ramp generator with a comparator;
providing the digital representation of the image charge voltage signal in response to said comparing the image charge voltage signal to the ramp signal;
generating the ramp signal at an output of an op amp having first and second inputs, wherein the op amp is included in a ramp generator;
coupling an integrator capacitor between the first input and the output of the op amp;
coupling a current source to the first input of the op amp;
coupling a reference voltage capacitance to the second input of the op amp;
sampling a reference voltage onto the reference voltage capacitance with a sampling switch coupled between the reference voltage and the reference voltage capacitance; and
reducing the reference voltage sampled onto the reference voltage capacitance during the ramp event in the ramp signal with a tuning circuit coupled to the second input of the op amp to reduce a delay of the ramp event in the ramp signal.

20. The method of claim 19, further comprising enabling and disabling an enable switch coupled between the between the first input and the output of the op amp.

21. The method of claim 19, wherein the tuning circuit comprises:
a tuning capacitance coupled to the second input of the op amp; and
switching circuitry coupled to the tuning capacitance, wherein the method further comprises:
coupling the tuning capacitance to a tuning voltage with the switching circuitry when the ramp generator is disabled; and
coupling the tuning capacitance to ground when the ramp generator is enabled.

22. The method of claim 21, wherein the switching circuitry comprises:
a first switch coupled between the tuning voltage and the tuning capacitance; and
a second switch coupled between the tuning capacitance and ground.

23. The method of claim 21, wherein the tuning capacitance comprises a variable capacitance, wherein the method further comprises tuning the variable capacitance to cause the ramp event in the ramp signal to be linear.

24. The method of claim 21, wherein a product of the tuning voltage and the tuning capacitance divided by a sum of the tuning capacitance and the reference voltage capacitance is equal to a constant.

* * * * *